United States Patent
Huh et al.

(10) Patent No.: US 6,410,382 B1
(45) Date of Patent: Jun. 25, 2002

(54) FABRICATION METHOD OF SEMICONDUCTOR DEVICE

(75) Inventors: Ki Jae Huh, Jincheon; Duk Hee Lee, Seoul, both of (KR)

(73) Assignee: Hyundai Electronics Industries Co., Ltd., Kyoungki-Do (KR)

( * ) Notice: Subject to any disclaimer, the term of this patent is extended or adjusted under 35 U.S.C. 154(b) by 0 days.

(21) Appl. No.: 09/434,521

(22) Filed: Nov. 5, 1999

(30) Foreign Application Priority Data

Apr. 19, 1999 (KR) .................................. 99-13786

(51) Int. Cl.$^7$ .......................................... H01L 21/8242
(52) U.S. Cl. ...................... 438/241; 438/258; 438/231; 438/275; 438/302; 438/305
(58) Field of Search ................. 438/258, 241, 438/231, 275, 302, 305

(56) References Cited

U.S. PATENT DOCUMENTS

| | | | | |
|---|---|---|---|---|
| 5,516,707 A | * | 5/1996 | Loh et al. .................... | 257/607 |
| 5,804,496 A | * | 9/1998 | Duane ......................... | 438/520 |
| 5,910,672 A | * | 6/1999 | Iwanmatsu et al. ......... | 257/347 |
| 5,920,782 A | * | 7/1999 | Shih et al. ................... | 438/303 |
| 5,972,783 A | * | 10/1999 | Arai et al. ................... | 438/513 |
| 6,037,639 A | * | 3/2000 | Ahmad ........................ | 257/401 |
| 6,087,237 A | * | 7/2000 | Hwang ........................ | 438/302 |
| 6,090,653 A | * | 7/2000 | Wu .............................. | 438/231 |
| 6,127,248 A | * | 10/2000 | Kim ............................. | 438/528 |
| 6,184,110 B1 | * | 2/2001 | Ono et al. ................... | 438/513 |
| 6,225,151 B1 | * | 5/2001 | Gardner et al. ............ | 438/162 |
| 6,225,167 B1 | * | 5/2001 | Yu et al. ..................... | 438/275 |
| 6,235,600 B1 | * | 5/2001 | Chiang et al. .............. | 438/305 |

OTHER PUBLICATIONS

"Gate Electrode Engineering by Control of Grain Growth for High Performance and High Reliable 0.18$\mu$m Dual Gate CMOS", by S. Shimizu, et al., 1997, Symposium on VLSI Technology Digest of Technical Papers pp. 107–108.

"High Frequency AC Characteristics of 1.5 nm Gate Oxide MOSFETs", by Hisayo Sasaki Momose, et al., 1996, IEDM, pp. 105–108.

* cited by examiner

Primary Examiner—John F. Niebling
Assistant Examiner—Jennifer M. Kennedy
(74) Attorney, Agent, or Firm—Fleshner & Kim, LLP

(57) ABSTRACT

A fabrication method of a semiconductor device improves the hot carrier immunity and prevents the deterioration of electrical characteristics of p-channel transistors. The fabrication method of the semiconductor device includes: sequentially forming a gate insulating film and a gate electrode; implanting low-density impurity ions into the semiconductor substrate at both sides of the gate electrode; forming sidewall spacers on side surfaces of the gate electrode; and implanting high-density impurity ions into the semiconductor substrate using the sidewall spacers as a mask, thereby forming source/drain regions. In methods embodying the invention, before or after forming the sidewall spacers, nitrogen ions are implanted into a portion of the gate insulating film adjacent to outer sides of the gate electrode. Thus, the semiconductor device is fabricated, with a silicon oxide gate insulating film formed over a channel region of a transistor, and a nitrogen oxide gate insulating film formed over the semiconductor substrate at outer sides of the channel region.

21 Claims, 4 Drawing Sheets

FABRICATION METHOD OF SEMICONDUCTOR DEVICE

BACKGROUND OF THE INVENTION

1. Field of the Invention

The present invention relates to a fabrication method of a semiconductor device that improves hot carrier immunity.

2. Background of the Related Art

In a background art method of fabricating a MOSFET (metal oxide semiconductor field effect transistor), an $SiO_2$ film formed by thermal oxidation is generally used as a gate insulating film. However, as semiconductor device integration has increased, channel length has shortened and hot carrier immunity has deteriorated. One improved background art fabrication method increases an energy band between the channel and the gate insulating film. Another improved background art method substitutes a nitrogen oxide film, such as NO or $N_2O$, for the $SiO_2$ film.

FIG. 1A shows a background art fabrication method for a semiconductor device that employs an NO or $N_2O$ gate insulating film 101 formed on a semiconductor substrate 100. A polysilicon film and an insulating film are formed and then patterned on the gate insulating film 101 to form a gate electrode 102 and an insulating pattern 103, respectively. Using the insulating pattern 103 as a mask, impurity ions are implanted into the semiconductor substrate 100, to form a shallow impurity layer, or a lightly doped drain (LDD) region 104 in the semiconductor substrate 100 at both sides of the gate electrode 102.

As illustrated in FIG. 1B, an $Si_3N_4$ film is then formed as an insulating film over the resultant structure of FIG. 1A, and the $SI_3N_4$ film is anisotropically etched to form sidewall spacers 105 on side surfaces of the gate electrode 102 and the insulating pattern 103. Then, high-density impurity ions are implanted into the semiconductor substrate 100 using the insulating pattern 103 and the sidewall spacers 105 as a mask, to form an impurity layer (i.e. source/drain) 106.

The background art methods have various disadvantages. Forming the gate insulating film 101 with the NO or $N_2O$ film improves the hot carrier immunity, but decreases the mobility of holes of a p-channel transistor, and thus deteriorates the driving capability of the p-channel transistor.

In addition, while the NO film provides a desirable gate insulating film with excellent hot carrier immunity in a semiconductor memory device divided into a memory cell part and a peripheral circuit part, a silicon oxide film provides an advantageous gate insulating film for the memory cell part. The NO film increases the junction leakage current in the memory cell part, and the refresh cycle is unavoidably shortened. Thus, the gate insulating films of the memory cell and peripheral circuit parts must be formed using different materials. Accordingly, the fabrication method of the conventional semiconductor device is complicated, because the gate insulating film must be formed twice so that the gate insulating film of the memory cell and peripheral circuit parts can be formed sequentially, with the use of a photoresist mask for each step.

SUMMARY OF THE INVENTION

It is an object of the present invention to provide a fabrication method for a semiconductor device which improves hot carrier immunity.

It is another object of the present invention to provide a fabrication method for a semiconductor device that has a silicon oxide gate insulating film over a channel region of a transistor and a gate insulating film including nitrogen over an LDD layer to improve hot carrier immunity and prevent loss of mobility of the holes of a p-channel transistor.

It is also an object of the present invention to provide a fabrication method for a semiconductor device that simultaneously forms gate insulating films of a memory cell part and a peripheral circuit and that partially implants nitrogen ions into the gate insulating film of the peripheral circuit part. This results in the formation of a gate insulating film over the peripheral circuit part as an oxide film including nitrogen. The oxide film including nitrogen helps to improve the refresh cycle of the memory cell part and the hot carrier immunity of the peripheral circuit part.

A fabrication method of a semiconductor device embodying the present invention includes the steps of: forming a gate insulating film over a semiconductor substrate; forming a gate electrode on the gate insulating film; implanting low-density impurity ions into the semiconductor substrate at both sides of the gate electrode; forming sidewall spacers on side surfaces of the gate electrode; implanting nitrogen into at least one portion of the gate insulating film adjacent to the gate electrode; and implanting high-density impurity ions into the semiconductor substrate using the gate electrode and sidewall spacers as a mask, wherein the implanted high-density impurity ions form source/drain regions.

A fabrication method of a semiconductor device, embodying the invention, may also include the steps of: forming a gate insulating film over a semiconductor substrate; forming a gate electrode on the gate insulating film; implanting low-density impurity ions into the semiconductor substrate at both sides of the gate electrode wherein a plurality of shallow impurity layers are formed; forming sidewall spacers on side surfaces of the gate electrode; and implanting high-density impurity ions into the semiconductor substrate using the gate electrode and the sidewall spacers as a mask, thereby forming source/drain regions. Fabrication methods embodying the invention may also include a step of implanting nitrogen, by an ion implantation step, into a part of the gate insulating film which is adjacent to outer sides of the gate electrode either before or after forming the sidewall spacers.

An alternative fabrication method of a semiconductor device embodying the present invention includes the steps of: forming a gate insulating film over a semiconductor substrate comprising at least a memory cell part and a peripheral circuit part; forming a gate electrode on the memory cell part and the peripheral circuit part; implanting low-density impurity ions into the semiconductor substrate at both sides of each gate electrode, wherein shallow impurity layers are formed; forming sidewall spacers on at least one side surface of each gate electrode; forming a photoresist mask over the resultant surface of the semiconductor substrate corresponding to the memory cell part; implanting nitrogen ions into the gate insulating film formed under the sidewall spacers of the peripheral circuit part; removing the photoresist mask; and implanting high-density impurity ions into the semiconductor substrate at outer sides of the sidewall spacers, wherein high-density impurity regions which are formed are relatively deeper than the shallow impurity layers.

Another alternative method embodying the present invention includes the steps of: forming a gate insulating film over a semiconductor substrate which includes a memory cell part and a peripheral circuit part; forming gate electrodes on the memory cell part and the peripheral circuit part of the semiconductor substrate; implanting low-density impurity ions into the semiconductor substrate on both sides of each gate electrode, thereby forming shallow impurity layers; forming sidewall spacers on side surfaces of each gate electrode; forming a photoresist mask over the resultant surface of the semiconductor substrate corresponding to the memory cell part; implanting nitrogen ions into the gate insulating film formed under the sidewall spacers of the peripheral circuit part of the semiconductor substrate; removing the photoresist mask; and implanting high-density impurity ions into the semiconductor substrate on opposite sides of the sidewall spacers, thereby forming impurity layers which are relatively deeper than the shallow impurity layers.

A further alternative fabrication method of a semiconductor device embodying the present invention includes the steps of: forming a gate insulating film over a semiconductor substrate comprising at least a memory cell part and a peripheral circuit part; forming a gate electrode on each of the memory cell part and the peripheral circuit part; forming a photoresist mask over the resultant surface of the semiconductor substrate corresponding to the memory cell part; implanting nitrogen ions into at least one portion of the gate insulating film adjacent to the gate electrode formed in the peripheral circuit part; removing the photoresist mask; implanting low-density impurity ions into the semiconductor substrate at both sides of each gate electrode, such that shallow impurity layers are formed; forming sidewall spacers on at least one side surface of each gate electrode; and implanting high-density impurity ions into the semiconductor substrate at outer sides of the sidewall spacers to form impurity layers that are formed relatively deeper than the shallow impurity layers.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings, in which like reference numerals refer to like elements, and wherein.

DETAILED DESCRIPTION OF PREFERRED EMBODIMENTS

Figure 1A:
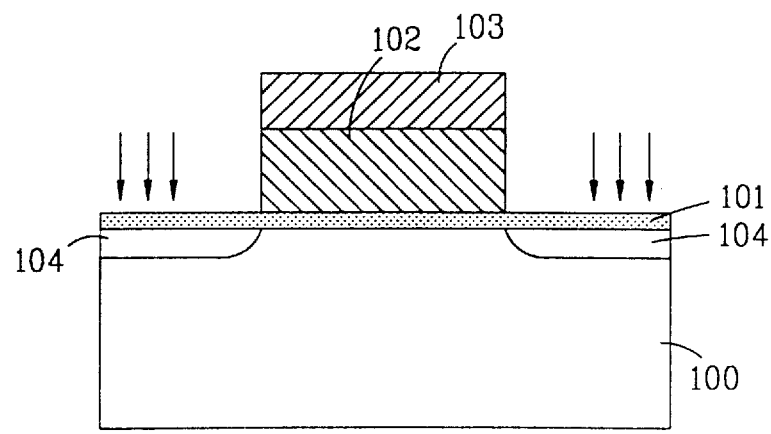
FIGS. 1A and 1B illustrate cross-sectional views of a fabrication method for a background art semiconductor device.
Figure 1B:
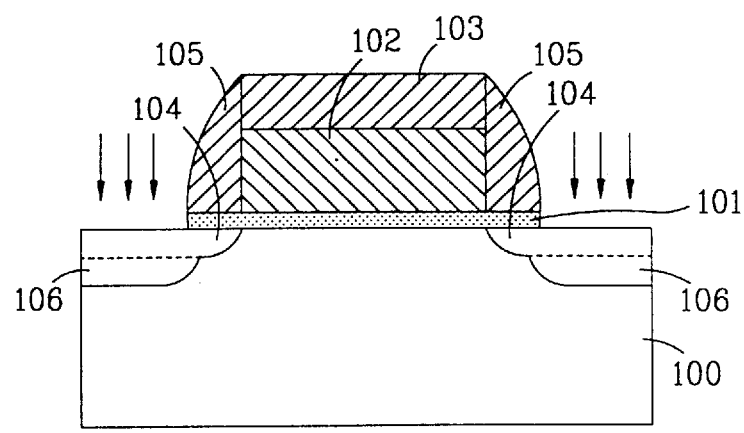
Figure 2A:
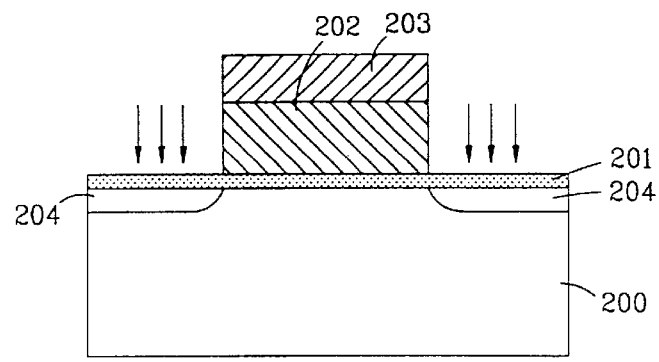
FIGS. 2A through 2C illustrate cross-sectional views of a fabrication method for a semiconductor device according to a first preferred embodiment of the present invention.
Figure 2B:
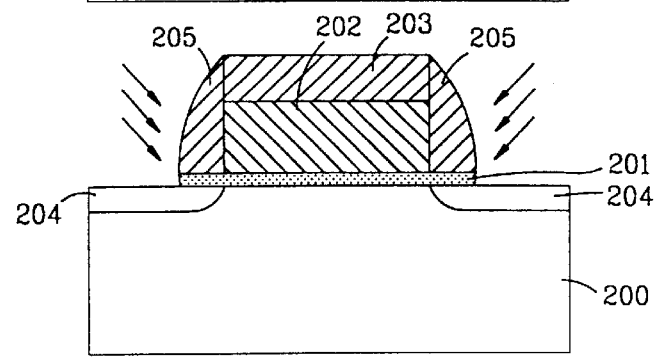
Figure 2C:
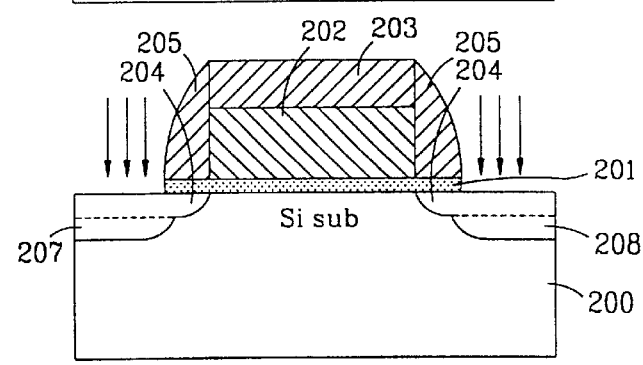

FIGS. 2A through 2C illustrate a fabrication method for a semiconductor device according to a first preferred embodiment of the present invention. FIG. 2A illustrates an $SiO_2$ gate insulating film 201 formed over a semiconductor substrate 200. A polysilicon layer and an insulating film are sequentially formed and patterned over the gate insulating film 201 to form a gate electrode 202 and an insulating film pattern 203, respectively. The insulating film pattern 203 is an HLD (high temperature, low pressure deposition) oxide film formed by an HL CVD (high temperature, low pressure chemical vapor deposition) method. An LDD (lightly doped drain) layer 204 is then formed in the semiconductor substrate 200 at both sides of the gate electrode 202 by using the insulating film pattern 203 as a mask to implant low-density p-type impurity ions into the substrate 200.

FIG. 2B illustrates the formation of sidewall spacers 205 on side surfaces of the gate electrode 202 and insulating pattern 203. To form the sidewall spacers 205, an $Si_3N_4$ insulating film is formed over the resultant structure of FIG. 2A, and the $Si_3N_4$ film is then anisotropically etched. In an alternate preferred embodiment of the present invention, the sidewall spacers 205 can be formed from an $SiO_2$ film with a large etching selection ratio with respect to the silicon substrate 200.

FIG. 2B also illustrates a tilt angle ion implantation step. Nitrogen ions are implanted into the gate insulating film 201 under the sidewall spacers 205 on either side of the gate electrode 202. The nitrogen ions are implanted at a tilt angle of about 30° from the semiconductor substrate 200 surface, and at an ion implantation energy of about 50 to 60 KeV. It is also desirable to implant the ions at an ion implantation energy under about 100 KeV, since an excessively high ion implantation energy results in the nitrogen ions being implanted into the semiconductor substrate 200. Further, if the tilt angle is too low, the nitrogen ions can be implanted into the portion of the gate insulating film 201 under the gate electrode 202, as well as into the portion of the gate insulating film 201 formed under the sidewall spacers 205.

The implanted nitrogen ions have Si—N bonds at the interface of the silicon substrate 200 and the gate insulating film 201. Accordingly, the Si—N bonds increase an energy barrier at that interface, and thus prevent the hot carrier from being implanted into the gate insulating film 201.

FIG. 2C illustrates the formation of a source 207 and a drain 208, by using the sidewall spacers 205 as a mask to implant high-density $p^+$-type impurity ions into the semiconductor substrate 200. In the present preferred embodiment of the invention, $BF_2$ is implanted into the semiconductor substrate 200 as the high-density $p^+$-type impurity ions.

In an alternate preferred embodiment of the present invention, the nitrogen ion implantation process can be applied before forming the sidewall spacers 205. Thus, after the gate electrode 202 forms, the nitrogen ions are implanted into the gate insulation film formed adjacent to the sides of the gate electrode 202. Then, the sidewall spacers 205 are formed at the sides of the gate electrode 202. In this embodiment, the tilt angle ion implantation or a general ion implantation can be applied. When implanting the nitrogen ions before forming the sidewall spacers, an ion implantation energy of about 10–20 KeV is desired.

Figure 3:
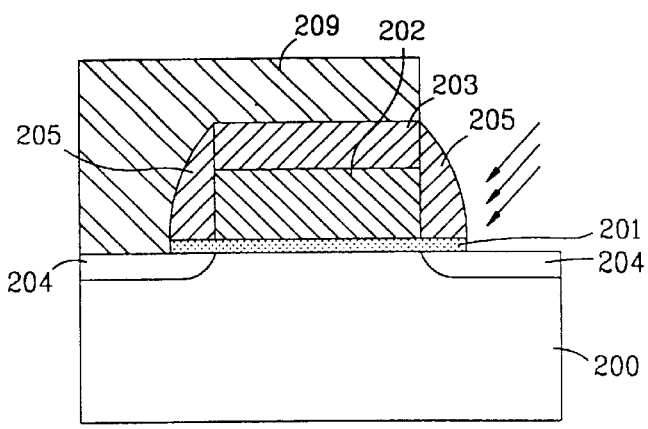
FIG. 3 illustrates a cross-sectional view of a fabrication method for a semiconductor device according to a second preferred embodiment of the present invention.

FIG. 3 illustrates the use of a photoresist pattern 209 in the tilt angle ion implantation step. In this second preferred embodiment of the present invention, the method steps are substantially similar to the method steps shown in FIGS. 2A through 2C, except for the use of the photoresist pattern 209. The photoresist pattern 209 is formed over an LDD layer 204 in which a source is to be formed, and over the gate electrode 202. Nitrogen ions are then implanted into a gate insulating film 201 formed on an LDD layer 204 in which a drain is to be formed. The method is useful because the hot carrier is often generated at a periphery of the drain, which has the strongest electric field.

FIGS. 4A through 4D illustrate a method of applying the process of implanting nitrogen ions in the gate insulating film according to a third preferred embodiment of the present invention. In this embodiment, a fabrication process of a memory cell part is illustrated on the left-hand side, and a fabrication process of a peripheral circuit part is illustrated on the right-hand side.

Figure 4A:
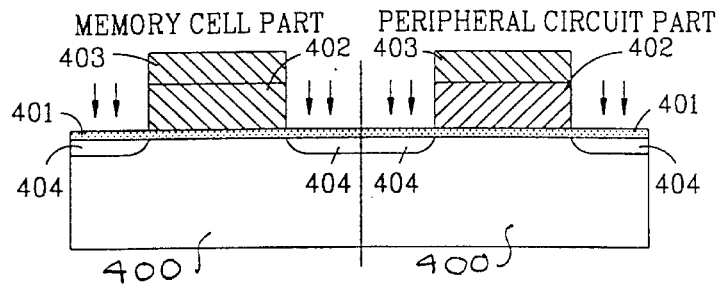
FIGS. 4A through 4D sequentially illustrate cross-sectional views of a fabrication method for a semiconductor device according to a third preferred embodiment of the present invention.

FIG. 4A illustrates a device isolation region (not shown) formed on a semiconductor substrate 400, and an SiO$_2$ gate insulating film 401 formed over the semiconductor substrate 400. Then, a polysilicon layer and an insulating film are sequentially formed and patterned over the SiO$_2$ gate insulating film to form gate electrodes 402 and insulating film patterns 403, respectively. The insulating film patterns protect upper surfaces of the gate electrodes 402 for the memory cell part and the peripheral circuit part. Using the insulating patterns 402 as a mask, low-density impurity ions are then implanted into the semiconductor substrate 400 to form lightly doped drain regions (LDD) 404.

Figure 4B:
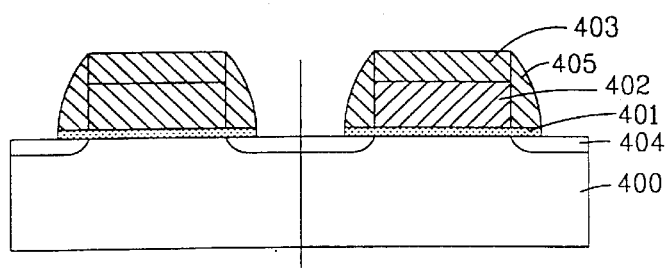

FIG. 4B illustrates the formation of sidewall spacers 405. A silicon oxide film or a silicon nitride film is formed as an insulating film over the surface of the resultant structure of FIG. 4A, and the insulating film is then anisotropically etched to form sidewall spacers 405 on side surfaces of the gate electrodes 402.

Figure 4C:
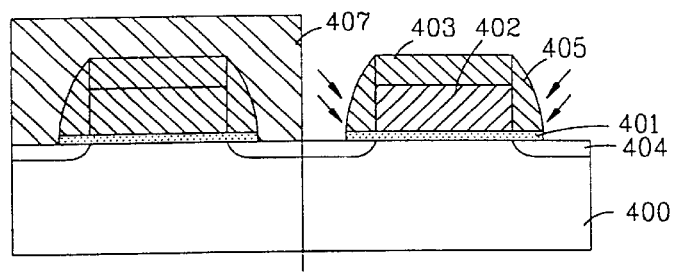

FIG. 4C illustrates the tilt angle nitrogen ion implementation process as applied to the present embodiment of the invention. A photoresist mask 407 is formed on the memory cell part, and nitrogen is ion-implanted into a portion of the gate insulating film 401 formed under the sidewall spacers 405 of the peripheral circuit part. A preferred ion implantation tilt angle of about 30° and an ion implantation energy of about 50–60 KeV are desired.

Figure 4D:
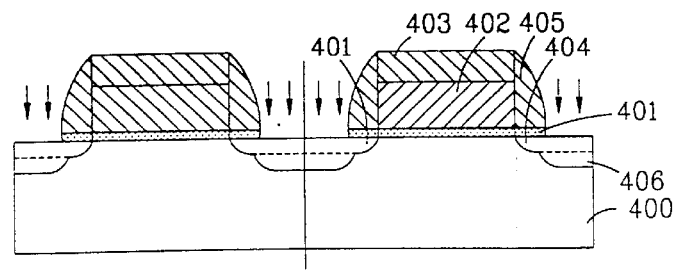

FIG. 4D illustrates the implantation of high-density impurity ions to form source and drain regions 406. Using the sidewall spacers 405 as a mask, high-density impurity ions are implanted into the semiconductor substrate 400, thereby forming impurity layers 406 deeper than the lightly doped drain regions 404. These impurity layers 406 serve as a source/drain of the transistor.

FIGS. 5A through 5D illustrate a fabrication method of a semiconductor device according to a fourth preferred embodiment of the present invention, wherein a fabrication process of a memory cell part is illustrated on the left-hand side, and a fabrication process of a peripheral circuit part is illustrated on the right-hand side.

Figure 5A:
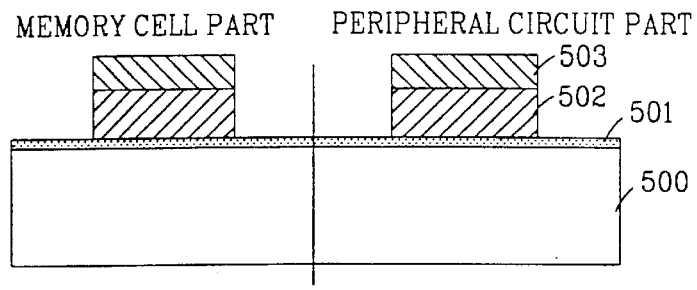
FIGS. 5A through 5D sequentially illustrate cross-sectional views of a fabrication method for a semiconductor device according to a fourth preferred embodiment of the present invention.

FIG. 5A illustrates an SiO$_2$ gate insulating film 501, a gate electrode 502, and an insulating film pattern 503 formed over a substrate 500. A device isolation area (not shown) is formed over the semiconductor substrate 500, and the SiO$_2$ gate insulating film 501 is then formed over the semiconductor substrate 500. A polysilicon layer and an insulating film are sequentially formed and patterned over the silicon oxide film 501 to form gate electrodes 502 and insulating film patterns 503, respectively. The insulating film patterns 503 protect upper surfaces of the gate electrodes 502 of the memory cell part and the peripheral circuit part.

Figure 5B:
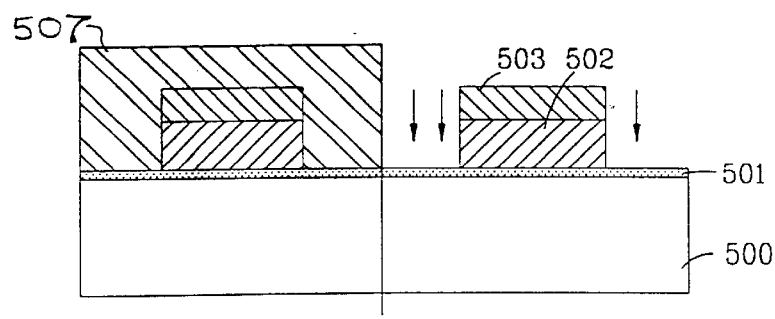

FIG. 5B illustrates the nitrogen ion implantation process. A photoresist mask 507 is formed on the memory cell part, and nitrogen is implanted into a portion of the SiO$_2$ gate insulating film 501 of the peripheral circuit part by an ion implantation method or a general ion implantation. An ion implantation energy of about 10–20 KeV is desired.

Figure 5C:
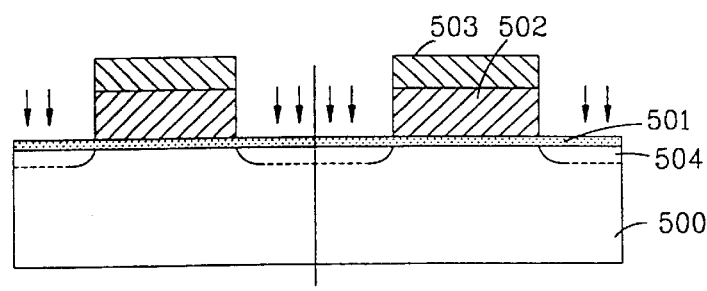

FIG. 5C illustrates formation of the LDD regions 504. After removing the photoresist mask 507 of the memory cell part, the insulating film patterns 503 are used as a mask to implant low-density impurity ions into the semiconductor substrate 500 of the memory cell part and the peripheral circuit part, thereby forming LDD layers 504.

Figure 5D:
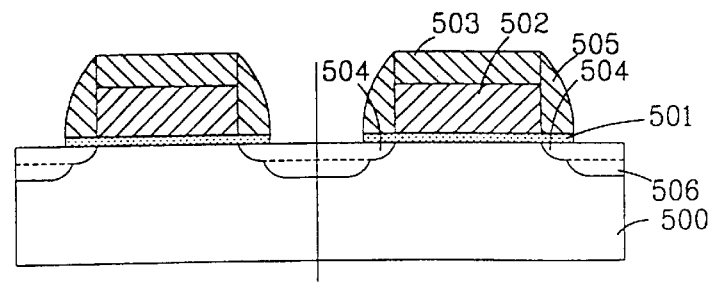

FIG. 5D illustrates the implantation of high-density ions to form source and drain regions 506. An insulating film, which could be a silicon layer or a silicon nitride film, is formed over the resultant surface of FIG. 5C of the semiconductor substrate 500, and the insulating film is anisotropically etched to form sidewall spacers 505 on side surfaces of the gate electrodes 502. The sidewall spacers 505 are then used as a mask to implant high-density impurity ions into the semiconductor substrate 500. Thus, impurity layers 506 are formed deeper than the lightly doped drain regions 504. These impurity layers 506 serve as a source/drain of the transistor.

A fabrication method for a semiconductor device embodying the present invention has various advantages. Because the NO gate insulating film of the present invention only forms under the sidewall spacers, and the SiO$_2$ gate insulating film remains under the gate electrode, hot carrier immunity is improved and deterioration of the p-channel transistor is prevented. Thus, the reliability of the semiconductor device is improved. As a result, the present invention obviates the background art disadvantage of decreased mobility of the p-channel holes, which occurs when a NO film is used in place of the SiO$_2$ film.

Additionally, the present invention obviates the disadvantage that occurs when a background fabrication method forms the gate insulating films of the memory circuit part and the peripheral circuit part different types of films, such as the SiO$_2$ and NO films, respectively. In the background art method it is necessary to first form the photoresist mask over the peripheral circuit part and the SiO$_2$ gate insulating film of the memory cell part, and then form another photoresist mask over the silicon oxide film, and the NO gate insulating film of the peripheral circuit. Since a photolithography process of the background art method is required twice, the fabricating method is complicated and expensive. In addition, the gate insulating film may be damaged by the cleaning process. In contrast, in a method embodying the present invention, the SiO₂ gate insulating film is formed without requiring a division of the memory cell part and the peripheral circuit part, and the nitrogen ions are sectionally implanted, so that the fabricating process is simplified. Thus, the problems and disadvantages of the background art are obviated.

The foregoing embodiments are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A fabrication method of a semiconductor device, comprising:
    forming a gate insulating film over a semiconductor substrate;
    forming a gate electrode on the gate insulating film;
    implanting low-density impurity ions into the semiconductor substrate at both sides of the gate electrode;
    forming sidewall spacers on side surfaces of the gate electrode;
    implanting nitrogen into at least one portion of the gate insulating film adjacent to the gate electrode, wherein the nitrogen implantation comprises,
    implanting nitrogen ions only into the gate insulating film formed under the sidewall spacers; and
    implanting high-density impurity ions into the semiconductor substrate using the gate electrode and the sidewall spacers as a mask, wherein the implanted high-density impurity ions form source/drain regions.

2. The fabrication method of claim 1, further comprising forming a photoresist pattern on the gate electrode and one of the sidewall spacers, wherein the nitrogen ion implantation comprises implanting nitrogen ions only into the gate insulating film formed under one of the sidewall spacers.

3. The fabrication method of claim 1, wherein the implanting the low-density impurity ions into the semiconductor substrates occurs after the implanting the nitrogen.

4. The fabrication method of claim 3, wherein the nitrogen ions are implanted into a portion of the gate insulating film formed under the sidewall spacer adjacent an area where a drain region is to be formed in a subsequent step.

5. The fabrication method of claim 1, wherein the nitrogen ion implantation comprises a tilt angle ion implantation.

6. The fabrication method of claim 5, wherein the nitrogen ion implantation is performed at about 50–60 KeV.

7. The fabrication method of claim 5, wherein the tilt angle ion implementation is performed at an angle of about 300 relative to a surface of the semiconductor substrate.

8. The fabrication method of claim 1, wherein the gate insulating film is a silicon oxide film.

9. The fabrication method of claim 1, wherein the nitrogen ion implantation step is performed at approximately 10–20 KeV.

10. A fabrication method of a semiconductor device, comprising:
    forming an SiO₂ gate insulating film over a semiconductor substrate comprising at least a memory cell part and a peripheral circuit part;
    forming a gate electrode on each of the memory cell part and the peripheral circuit part;
    implanting low-density impurity ions into the semiconductor substrate at both sides of each gate electrode, wherein a plurality of shallow impurity layers are formed;
    forming sidewall spacers on at least one side surface of each gate electrode;
    forming a photoresist mask over a resultant surface of the semiconductor substrate corresponding to the memory cell part;
    implanting nitrogen ions into the gate insulating film formed under the sidewall spacers of the peripheral circuit part;
    removing the photoresist mask; and
    implanting high-density impurity ions into the semiconductor substrate at outer sides of the sidewall spacers, wherein high-density impurity regions are formed in the substrate, the high-density impurity regions being located relatively deeper than the shallow impurity layers.

11. The fabrication method of claim 10, wherein the gate insulating film over the semiconductor substrate of the memory cell part has more mobility of holes than the gate insulating film over the semiconductor substrate of the peripheral circuit part.

12. The fabrication method of claim 10, wherein the nitrogen ion implantation comprises a tilt angle ion implantation that is performed at an angle of about 30° relative to a surface of the semiconductor substrate, and wherein an ion implantation energy is about 50–60 KeV.

13. The fabrication method of claim 10, wherein the nitrogen ion implantation comprises a tilt angle ion implantation.

14. The fabrication method of claim 10, wherein the implanting of the nitrogen ions into the gate insulating film formed under the sidewall spacers of the peripheral circuit part occurs only under the sidewall spacer.

15. A fabrication method of a semiconductor device, comprising:
    forming a gate insulating film over a semiconductor substrate comprising at least a memory cell part and a peripheral circuit part;
    forming a gate electrode on each of the memory cell part and the peripheral circuit part;
    forming a photoresist mask over the resultant surface of the semiconductor substrate corresponding to the memory cell part;
    implanting nitrogen ions only into the gate insulating film adjacent to the gate electrode formed in the peripheral circuit part;
    removing the photoresist mask;
    implanting low-density impurity ions into the semiconductor substrate at both sides of each gate electrode, wherein shallow impurity layers are formed;

forming sidewall spacers on at least one side surface of each gate electrode; and implanting high-density impurity ions into the semiconductor substrate at outer sides of the sidewall spacers, to form impurity layers in the substrate, the impurity layers are relatively deeper than the shallow impurity layers.

16. The fabrication method of claim 15, wherein the gate insulating film is a silicon oxide film.

17. The fabrication method of claim 15, wherein the nitrogen ion implantation comprises a tilt angle ion implantation that is performed at an angle of about 30° relative to a surface level of the semiconductor substrate, and wherein an ion implantation energy is about 10–20 KeV.

18. The fabrication method of claim 1, wherein the implanting of nitrogen forms silicon nitride bonds at the interface of the substrate and the gate insulating film under the sidewall spacers.

19. A fabrication method of a semiconductor device, comprising:

forming a gate insulating film over a semiconductor substrate;

forming a gate electrode on the gate insulating film;

implanting low-density impurity ions into the semiconductor substrate at both sides of the gate electrode;

forming sidewall spacers on side surfaces of the gate electrode;

implanting nitrogen ions using tilt angle ion implantation, wherein the tilt angle ion implantation consists of implanting nitrogen ions into the gate insulating film only under the sidewall spacers; and implanting high-density impurity ions into the semiconductor substrate using the gate electrode and the sidewall spacers as a mask, wherein the implanted high-density impurity ions form source/drain regions.

20. The fabrication method of claim 18, wherein the implanting the low-density impurity ions into the semiconductor substrates occurs after the implanting the nitrogen ions.

21. The fabrication method of claim 15, wherein the implanting of the nitrogen ions including through the sidewall spacer into the gate insulating film formed under the sidewall spacers of the peripheral circuit part occurs only under the sidewall spacer.

* * * * *